United States Patent [19]
Brooks

[11] Patent Number: 5,842,825
[45] Date of Patent: Dec. 1, 1998

[54] INCREMENTED ROTATED WAFER PLACEMENT ON ELECTRO-STATIC CHUCKS FOR METAL ETCH

[75] Inventor: Warren S. Brooks, Essex Junction, Vt.

[73] Assignee: International Business Machines Corporation, Armonk, N.Y.

[21] Appl. No.: 946,537

[22] Filed: Oct. 7, 1997

[51] Int. Cl.[6] .................................................. B65G 47/24
[52] U.S. Cl. .......................... 414/754; 414/936; 437/225
[58] Field of Search .................... 414/754, 783, 414/936, 941; 437/225, 236

[56] References Cited

U.S. PATENT DOCUMENTS

| | | | |
|---|---|---|---|
| 5,102,280 | 4/1992 | Poduje et al. | 414/225 |
| 5,207,437 | 5/1993 | Barnes et al. | 279/128 |
| 5,308,222 | 5/1994 | Bacchi et al. | 414/783 |
| 5,365,672 | 11/1994 | Kato | 33/520 |
| 5,511,934 | 4/1996 | Bacchi et al. | 414/783 |
| 5,513,948 | 5/1996 | Bacchi et al. | 414/783 |
| 5,535,090 | 7/1996 | Sherman | 361/234 |

FOREIGN PATENT DOCUMENTS

0725427A2  8/1996  European Pat. Off. .

Primary Examiner—Janice L. Krizek
Attorney, Agent, or Firm—DeLio & Peterson, LLC; Peter W. Peterson; James M. Leas

[57] ABSTRACT

A method of orienting wafers in an apparatus having a wafer receiving-workpiece holder such as an electro-static chuck for processing of the wafers and eliminating etch debris build-up at the wafer orienting notch. The method comprises the steps of first providing a plurality of wafers, each wafer having an orientation mark thereon and then securing a first wafer in the chuck with the first wafer orientation mark in a first position with respect to the chuck. Thereafter, the first wafer is removed from the chuck after desired processing of the first wafer. A subsequent wafer is secured in the chuck with the subsequent wafer orientation mark in a second position with respect to the chuck different than the first position. The position of the subsequent wafer orientation mark may be rotated a predetermined desired degree with respect to the position of the first wafer orientation mark, for example, between about 1 and 30 degrees with respect to the position of the first wafer orientation mark, more preferably between about 4 and 9 degrees. Alternatively, the position of the subsequent wafer orientation mark may be rotated a random degree with respect to the position of the first wafer orientation mark.

21 Claims, 2 Drawing Sheets

INCREMENTED ROTATED WAFER PLACEMENT ON ELECTRO-STATIC CHUCKS FOR METAL ETCH

BACKGROUND OF THE INVENTION

1. Field of the Invention

The present invention relates to a system for loading semiconducting wafers such as silicon wafers onto a workpiece holder such as an electro-static chuck for processing of the wafers.

2. Description of Related Art

Electro-static chucks are typically used as workpiece holders for semiconducting wafers during various processing of the wafer, for example, metal etching the surface of the wafer for further processing. The circular wafers utilized typically have notches placed along an edge thereof which form a cutout portion of the wafer edge. This notch often exposes a portion of the electro-static chuck surface below the wafer. The notch is typically placed in the same location on the chuck for each wafer processed. During processing such as metal etching there is typically a build-up of polymer and/or ceramic dust on the electro-static chuck surface.

It has been found in the present invention that unwanted and undesirable debris build-up can cause problems in cooling the wafer as it is secured in the chuck. In typical electrostatic chuck systems, for example, in the TCP 9600 system produced by LAM, helium is used to cool the underside of the wafer during etching to lower the temperature of the wafer. The helium is introduced through openings in the chuck surface, and the pressure thereof causes a slight upward bowing of the wafer. Through a closed loop system, the helium is flowed beneath the wafer to effect cooling. Normally, the chuck edge is in contact along its entire periphery with the underside of the wafer to contain the helium flow between the wafer and the chuck. The build-up of debris at a particular location on the edge of the chuck can cause a gap to form between the chuck edge and the underside of the wafer on either side of the debris location. This gap associated with the debris build-up causes helium outflow and therefore helium pressure problems as well as non-uniform cooling to the wafer. Such non-uniform cooling adversely affects the wafer etch profile and causes scrapping of improperly etched wafers.

Bearing in mind the problems and deficiencies of the prior art, it is therefore an object of the present invention to provide a method and apparatus for improving the cooling to a wafer during processing.

It is another object of the present invention to provide a method of reducing undesirable debris build-up in a particular location along the edge of an electrostatic chuck used to hold a wafer.

A further object of the present invention is to provide a system for preventing the formation of a gap between the edge of the chuck and the wafer which adversely affects cooling of the wafer.

It is yet another object of the present invention to provide a system for loading the wafers onto a chuck to prevent the aforementioned problems.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of orienting wafers in an apparatus having a wafer receiving-workpiece holder for processing of the wafers comprising the steps of first providing a plurality of wafers, each wafer having an orientation mark thereon and then securing a first wafer in the workpiece holder with the first wafer orientation mark in a first position with respect to the workpiece holder. Thereafter, the first wafer is removed from the workpiece holder after desired processing of the first wafer. A subsequent wafer is secured in the workpiece holder with the subsequent wafer orientation mark in a second position with respect to the workpiece holder different than the first position.

The position of the subsequent wafer orientation mark may be rotated a predetermined desired degree with respect to the position of the first wafer orientation mark, for example, between about 1 and 30 degrees with respect to the position of the first wafer orientation mark, more preferably between about 4 and 9 degrees. Alternatively, the position of the subsequent wafer orientation mark may be rotated a random degree with respect to the position of the first wafer orientation mark.

In the preferred embodiment, the workpiece holder comprises an electrostatic chuck, and the wafers are secured to the chuck by an electrostatic force between the wafers and the chuck.

Typically, each wafer orientation mark comprises a cut out region at a periphery of the wafer, wherein each wafer orientation mark exposes a portion of the workpiece holder during processing.

In another aspect, the present invention relates to a method of orienting wafers in an apparatus having a wafer receiving-chuck for processing of the wafers comprising the steps of providing a chuck having a surface and providing a plurality of wafers, with each wafer having a cut out portion near the periphery of the wafer such that when the wafers are secured in the chuck, the wafer cut out portions expose a portion of the chuck surface. The method then includes sequentially securing the wafers in the chuck and processing the wafers such that no portion of the chuck surface is exposed to process conditions more than any other portion of the chuck surface. Preferably, the chuck is substantially circular and has a surface of radius R, and the wafers are substantially circular and of radius r (wherein R is less than r), with each wafer having a center and a cut out portion near the periphery of the wafer at a distance c from the center such that the wafer cut out portions uniformly expose at least a portion of the periphery of the chuck surface.

The method may further include, for each wafer secured to the workpiece holder, the step of storing the position of each orientation mark with respect to the workpiece holder, for example, to correlate defects on the wafer and workpiece holder surface.

Preferably, the wafers comprise a plurality of process lots, each process lot comprising a plurality of wafers, each wafer having a wafer orientation mark, wherein each wafer in a first wafer process lot is secured to the workpiece holder with the orientation mark in the first position, and wherein each wafer in a subsequent wafer process lot is secured to the workpiece holder with the orientation mark in the second position.

In a further aspect, the present invention provides an apparatus for orienting wafers in a wafer receiving-chuck for processing of the wafers comprising a wafer receiving-chuck having a surface and a plurality of wafers, each wafer having a cut out portion near the periphery of the wafer such that when the wafers are secured in the chuck, the wafer cut out portions expose a portion of the chuck surface. The apparatus also includes means for sequentially securing the wafers in the chuck and processing the wafers such that no portion of the chuck surface is exposed to process conditions more than any other portion of the chuck surface.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
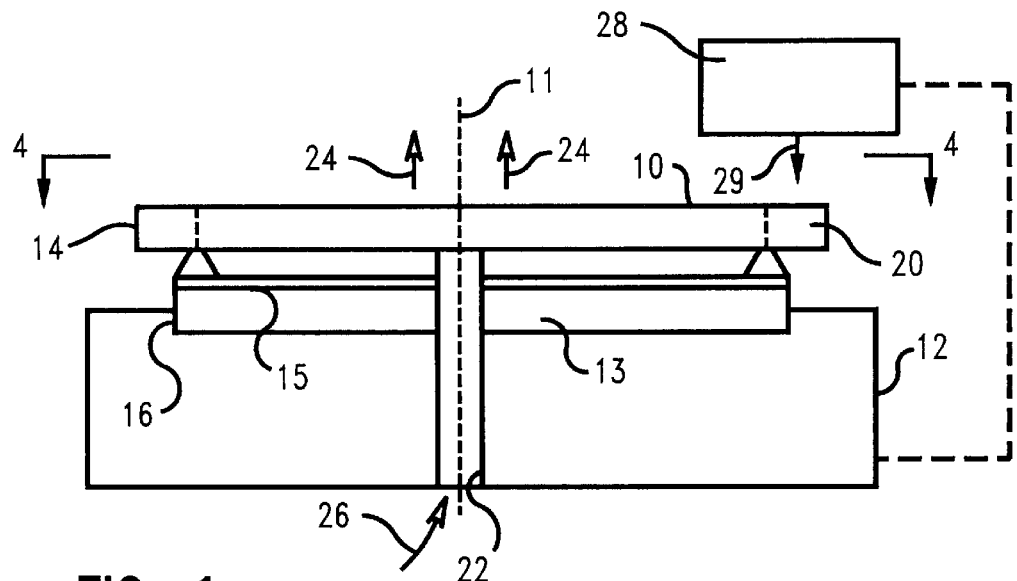
FIG. 1 is an elevational view of a wafer secured to a chuck in accordance with a preferred embodiment of the present invention.

In describing the preferred embodiment of the present invention, reference will be made herein to FIGS. 1 and 2 of the drawings in which like numerals refer to like features of the invention. Features of the invention are not necessarily shown to scale in the drawings.

Figure 2:
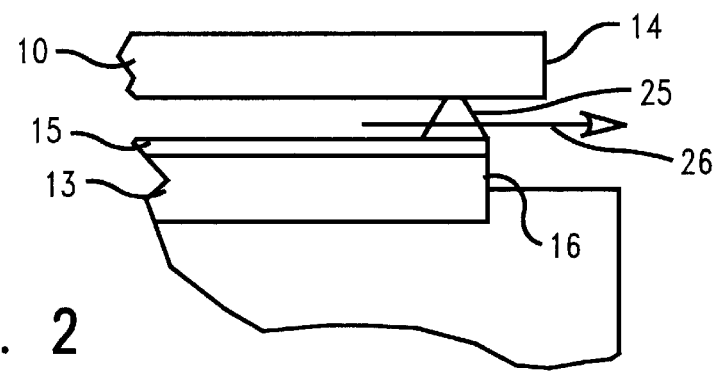
FIG. 2 is an enlarged elevational view of a portion of the wafer and chuck edge in the apparatus of FIG. 1 showing undesirable debris build-up and its effects.

A preferred embodiment of the present invention is depicted in FIG. 1, in which a wafer 10 is mounted on a workpiece holder such as an electrostatic chuck system. The chuck system comprises the base 12 which secures and rotates circular chuck 13 around a central axis 11. The chuck 13 has a upper dielectric layer 15 on which wafer 10 normally rests and is secured by electrostatic force, as in well-known prior art systems. A central opening 22 through the chuck and dielectric layer permits a cooling gas such as helium 26 to flow. The diameter of chuck 13 is slightly smaller than that of wafer 10 such that the chuck edge 16 is slightly inward of wafer edge 14.

During processing such as aluminum etching of the wafer upper surface, the flow of helium 26 causes an over pressure between the underside of the wafer and the top side of the chuck system such that the central portion of the wafer 10 is slightly bowed upward (arrows 24) to create a small gap through which the helium flows and cools the underside of the wafer. The edges 16 of the chuck normally remain in contact with the underside of wafer 10 near wafer edge 14 to prevent outflow of the helium gas 26.

Figure 3:
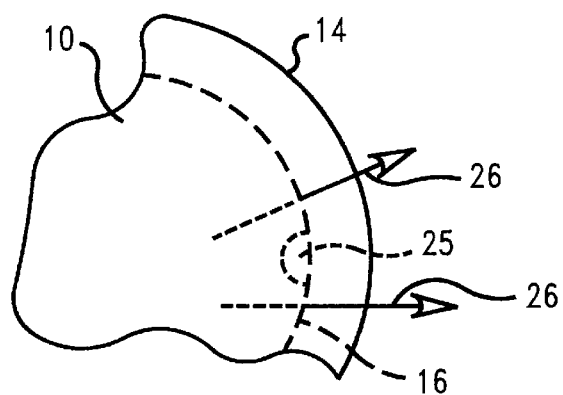
FIG. 3 is a top plan view of the enlarged wafer and chuck edge of FIG. 2.

To orient the wafer 10 during etching and subsequent processing, there is provided a notch 20 which comprises a cutout portion of edge 14. Notch 20 has a depth such that it exposes a portion of the upper surface of the electrostatic chuck. As shown in FIGS. 2 and 3, repeatedly locating this notch 20 at the same location causes a build-up 25 of ceramic/polymer dust on the surface of the electrostatic chuck near chuck edge 16. If the notch of the wafer is placed in a slightly different location after this build-up 25 is created, there can be formed a gap between chuck edge 16 and the underside of wafer 10 near the wafer edge 14 which permits outflow of helium 26 adjacent to debris 25 (FIG. 3). This outflow of helium will cause differential cooling of the wafer which will then typically result in differential etching of the wafer surface.

Figure 4:
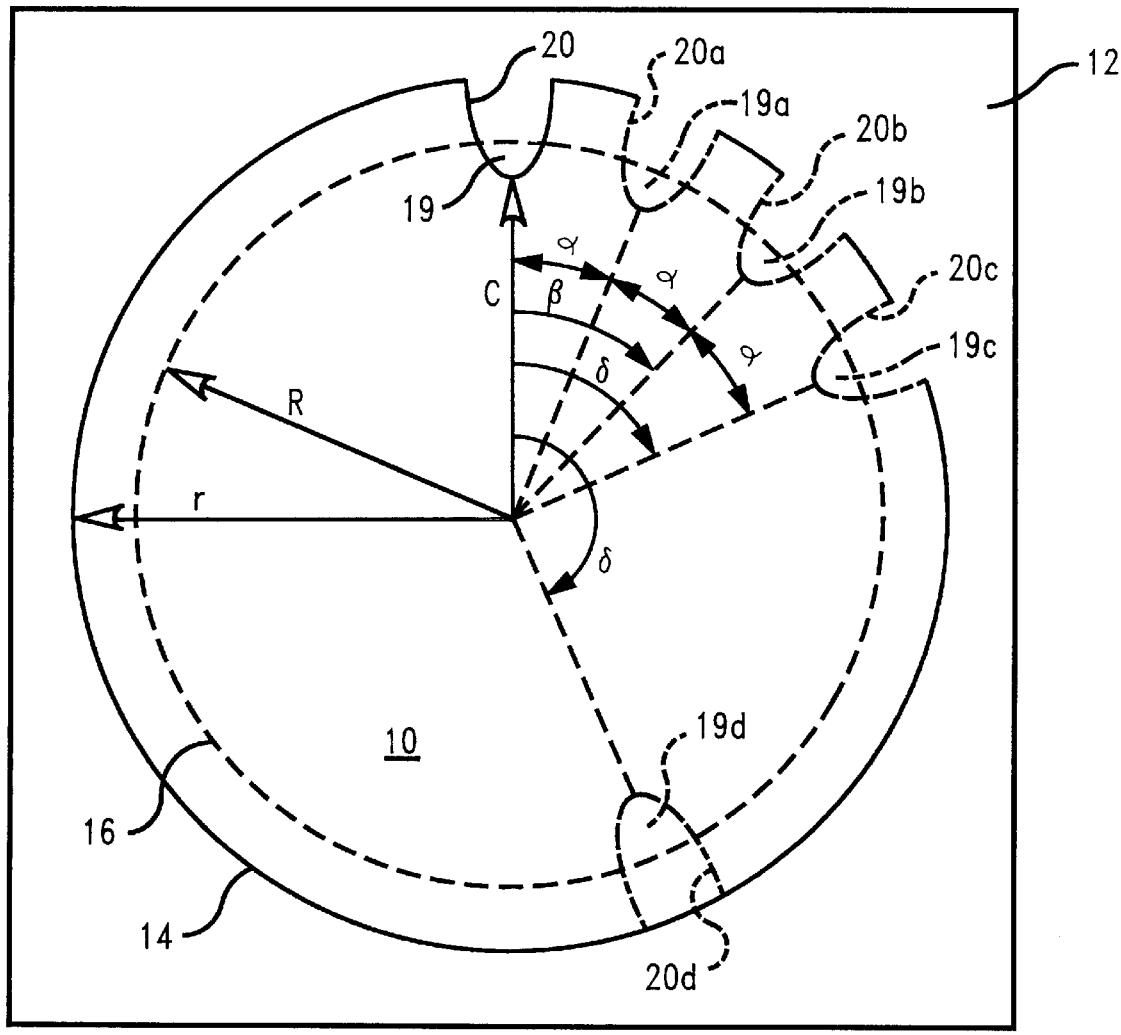
FIG. 4 is a top plan view of the wafer secured in the chuck shown in FIG. 1 and rotated in accordance with the teachings of the present invention to prevent debris build-up.

The solution afforded by the present invention is shown in more detail in FIG. 4, which is a top plan view of the apparatus shown in FIG. 1. The wafer 10 has a radius r while electrostatic chuck beneath it has a radius R, with r>R, such that the edge 16 of the chuck has a smaller diameter than edge 14 of the wafer. Notch 20 has a cutout portion which at its base is a distance c from the center of the wafer. Because c is less than R, there is exposed portion 19 of the surface of the electrostatic chuck. It is this exposed portion 19 which can receive the undesired build-up of debris if notch 20 of subsequent wafers is repeatedly placed on that location in the same orientation on the chuck surface. In accordance with the present invention, the location of the wafer notch is regularly moved to a different rotation orientation on the chuck, so that different portions of the chuck are exposed by notch 20 and no portion of the chuck surface is exposed to process conditions more than any other portion of the chuck surface. Thus, any debris build-up will be uniform and/or predictable and will reduce or prevent gaps from forming which cause outflow of cooling helium gas between the underside of the wafer and the top side of the chuck edge 16.

In one embodiment, a first lot of wafers is oriented in the 0° position shown by notch 20, exposing chuck surface portion 19. A second subsequent lot of wafers would then be oriented at a different rotational position shown by notch 20a, which exposes different chuck surface portion 19a. The degree of angular rotation is shown by angle α. Such angle α may be any desired predetermined rotation, preferably between about 1 and 30 degrees, more preferably between about 4 and 9 degrees, inclusive, most preferably about 9 degrees. A next lot of wafers 10 would then be rotated by another incremental angle α, at an angle β from the original orientation, to the position of notch 20b exposing chuck surface portion 19b. The next lot of wafer would then be rotated further angle α (angle γ from the original orientation) to notch position 20c exposing chuck wafer surface portion 19c, and so on. Alternatively, each subsequent individual wafer can be rotated by the desired angle α.

In another embodiment, each wafer or sequential lot of wafers may be rotated by a random degree (angle δ) to notch position 20d exposing chuck surface position 19d.

To effect this sequential rotation of the wafer notch with respect to the chuck surface, a microprocessor controller 28 (FIG. 1) may be utilized which is operatively in communication with the chuck system 12 to rotate the wafer to a desired specific or random orientation. An optical, mechanical or other type sensor 29 attached to controller 28 locates the edge of the wafer, aligns the edge and locates the notch 20. The controller then increments the notch to the desired degree. On the aforementioned LAM etch system, this control may be effected by modifying the software which usually orients the wafer to the same spot on the electrostatic chuck.

Controller 28 may also include a memory to store the relative location of notch 20 with respect to the chuck surface. In the event that there is an arc in the surface of the chuck, the position of the area of the wafer and chuck surface affected may be determined by referral to the system memory.

Accordingly, the present invention provides an improved method and apparatus for loading the wafers onto a chuck and improving the cooling to a wafer during processing. The invention reduces undesirable debris build-up in a particular location along the edge of an electrostatic chuck used to hold a wafer and reduces the formation of a gap between the edge of the chuck and the wafer. In implementing the present invention, there has been found to result extended life in the chuck as well as a decrease in the amount of wafer defects, as compared to the prior system where the notch was always placed in the same orientation on the chuck surface.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of orienting wafers in an apparatus having a wafer receiving-workpiece holder for processing of said wafers comprising the steps of:
   a) providing a plurality of wafers, each wafer having an orientation mark thereon;
   b) securing a first wafer in said workpiece holder with the first wafer orientation mark in a first position with respect to said workpiece holder;
   c) removing said first wafer from said workpiece holder after desired processing of said first wafer; and
   d) securing a subsequent wafer in said workpiece holder with the subsequent wafer orientation mark in a second position with respect to said workpiece holder different than said first position.

2. The method of claim 1 wherein the position of said subsequent wafer orientation mark is rotated a predetermined desired degree with respect to the position of said first wafer orientation mark.

3. The method of claim 2 wherein the position of said subsequent wafer orientation mark is rotated between about 1 and 30 degrees with respect to the position of said first wafer orientation mark.

4. The method of claim 1 wherein the position of said subsequent wafer orientation mark is rotated a random degree with respect to the position of said first wafer orientation mark.

5. The method of claim 1 wherein each wafer orientation mark comprises a cut out region at a periphery of the wafer, and wherein each wafer orientation mark exposes a portion of said workpiece holder during processing.

6. The method of claim 1 further including, for each wafer secured to said workpiece holder, the step of storing the position of each orientation mark with respect to said workpiece holder.

7. The method of claim 1 wherein said wafers comprise a plurality of process lots, each process lot comprising a plurality of wafers, each wafer having a wafer orientation mark, and wherein each wafer in a first wafer process lot is secured to said workpiece holder with the orientation mark in said first position, and wherein each wafer in a subsequent wafer process lot is secured to said workpiece holder with the orientation mark in said second position.

8. The method of claim 1 wherein said workpiece holder comprises an electrostatic chuck, and the wafers are secured to said chuck by an electrostatic force between the wafers and said chuck.

9. The method of claim 8 wherein the position of said subsequent wafer orientation mark is rotated a predetermined desired degree with respect to the position of said first wafer orientation mark.

10. The method of claim 8 wherein the position of said subsequent wafer orientation mark is rotated between about 4 and 9 degrees with respect to the position of said first wafer orientation mark.

11. The method of claim 8 wherein the position of said subsequent wafer orientation mark is rotated a random degree with respect to the position of said first wafer orientation mark.

12. The method of claim 8 wherein each wafer orientation mark comprises a cut out region at a periphery of the wafer, and wherein each wafer orientation mark exposes a portion of said chuck during processing.

13. The method of claim 8 further including, for each wafer secured to said chuck, the step of storing the position of each orientation mark with respect to said chuck.

14. A method of orienting wafers in an apparatus having a wafer receiving-chuck for processing of said wafers comprising the steps of:
   a) providing a chuck having a surface;
   b) providing a plurality of wafers, each wafer having a cut out portion near the periphery of the wafer such that when said wafers are secured in said chuck, said wafer cut out portions expose a portion of said chuck surface; and
   c) sequentially securing said wafers in said chuck and processing said wafers such that no portion of said chuck surface is exposed to process conditions more than any other portion of said chuck surface.

15. A method of claim 14 wherein said chuck is substantially circular and has a surface of radius R, and wherein said wafers are substantially circular and of radius r, wherein R is less than r, each wafer having a center and a cut out portion near the periphery of the wafer at a distance c from said center and wherein in step (c), said wafer cut out portions uniformly expose at least a portion of the periphery of said chuck surface.

16. The method of claim 14 wherein in step (c) the position of said wafer cut out portion for at least some of said wafers is rotated a predetermined desired degree with respect to said chuck.

17. The method of claim 16 wherein the position of said wafer cut out portion is rotated between about 1 and 30 degrees.

18. The method of claim 14 wherein in step (c) the position of said wafer cut out portion for at least some of said wafers is rotated a random degree with respect to said chuck.

19. The method of claim 14 further including, for each wafer secured to said chuck, the step of storing the position of each cut out portion with respect to said chuck.

20. The method of claim 14 wherein said wafers comprise a plurality of process lots, each process lot comprising a plurality of wafers, each wafer having a wafer cut out portion, and wherein in step (c) each wafer in a first wafer process lot is secured to said chuck with the cut out portion in a first position, and wherein each wafer in a subsequent wafer process lot is secured to said chuck with the cut out portion in a second position different from said first position.

21. Apparatus for orienting wafers in a wafer receiving-chuck for processing of said wafers comprising:

a wafer receiving-chuck having a surface;

a plurality of wafers, each wafer having a cut out portion near the periphery of the wafer such that when said wafers are secured in said chuck, said wafer cut out portions expose a portion of said chuck surface; and means for sequentially securing said wafers in said chuck and processing said wafers such that no portion of said chuck surface is exposed to process conditions more than any other portion of said chuck surface.

* * * * *